United States Patent
Mercado et al.

(10) Patent No.: US 7,177,099 B2
(45) Date of Patent: Feb. 13, 2007

(54) DEEP ULTRAVIOLET UNIT-MAGNIFICATION PROJECTION OPTICAL SYSTEM AND PROJECTION EXPOSURE APPARATUS

(75) Inventors: Romeo I. Mercado, Fremont, CA (US); Shiyu Zhang, Hayward, CA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 11/052,239

(22) Filed: Feb. 7, 2005

(65) Prior Publication Data

US 2005/0146690 A1    Jul. 7, 2005

Related U.S. Application Data

(63) Continuation-in-part of application No. 10/447,128, filed on May 27, 2003, now Pat. No. 6,863,403.

(51) Int. Cl.
G02B 27/10     (2006.01)
G02B 9/34      (2006.01)
G03B 27/54     (2006.01)

(52) U.S. Cl. .................. 359/726; 359/773; 355/67
(58) Field of Classification Search ........ 359/726, 359/727, 355, 357, 649, 650, 686, 773, 809; 355/67, 53, 55
See application file for complete search history.

(56) References Cited

U.S. PATENT DOCUMENTS

| | | | |
|---|---|---|---|
| 4,103,989 A | 8/1978 | Rosin | 350/199 |
| 4,171,870 A | 10/1979 | Bruning et al. | 350/173 |
| 4,391,494 A | 7/1983 | Hershel | 350/442 |
| 4,425,037 A | 1/1984 | Hershel et al. | 355/43 |
| 4,964,705 A | 10/1990 | Markle | 350/442 |
| 5,031,977 A | 7/1991 | Gibson | 350/1.4 |
| 5,040,882 A | 8/1991 | Markle | 359/727 |
| 5,161,062 A | 11/1992 | Shafer et al. | 359/785 |
| 5,559,629 A | 9/1996 | Sheets et al. | 359/364 |
| 5,805,356 A | 9/1998 | Chiba | 359/727 |
| 5,835,195 A * | 11/1998 | Gibson et al. | 355/53 |
| 6,157,497 A * | 12/2000 | Kumazawa | 359/727 |
| 6,381,077 B1 * | 4/2002 | Jeong et al. | 359/726 |

* cited by examiner

*Primary Examiner*—Alicia M Harrington
(74) *Attorney, Agent, or Firm*—Allston L. Jones (57) ABSTRACT

A 1× projection optical system for deep ultra-violet (DUV) photolithography is disclosed. The optical system is a modified Dyson system capable of imaging a relatively large field at high numerical apertures at DUV wavelengths. The optical system includes a lens group having first and second prisms and four lenses having a positive-negative-positive negative arrangement as arranged in order from the prisms toward the mirror. A projection photolithography system that employs the projection optical system of the invention is also disclosed.

14 Claims, 4 Drawing Sheets

DEEP ULTRAVIOLET UNIT-MAGNIFICATION PROJECTION OPTICAL SYSTEM AND PROJECTION EXPOSURE APPARATUS

This application is a continuation-in-part application of the application having Ser. No. 10/447,128 filed on May 27, 2003, now U.S. Pat. No. 6,863,403 issued Mar. 8, 2005.

BACKGROUND OF THE INVENTION

1. Field of the Invention

The present invention relates to optical projection systems, and in particular to deep ultra-violet, large-field unit-magnification projection optical systems.

2. Description of the Prior Art

Photolithography is presently employed not only in sub-micron resolution integrated circuit (IC) manufacturing, but also to an increasing degree in advanced wafer-level IC packaging as well as in semiconductor, microelectromechanical systems (MEMS), nanotechnology (i.e., forming nanoscale structures and devices), and other applications.

The present invention, as described in the Detailed Description of the Invention section below, is related to the optical system described in U.S. Pat. No. 4,391,494 (hereinafter, "the '494 patent") issued on Jul. 5, 1983 to Ronald S. Hershel and assigned to General Signal Corporation, which patent is hereby incorporated by reference. In addition, the present invention as described below is also related to the optical system described in U.S. Pat. No. 5,031,977 ("the '977 patent"), issued on Jul. 16, 1991 to John A. Gibson and assigned to General Signal Corporation, which patent is hereby incorporated by reference.

Figure 1:
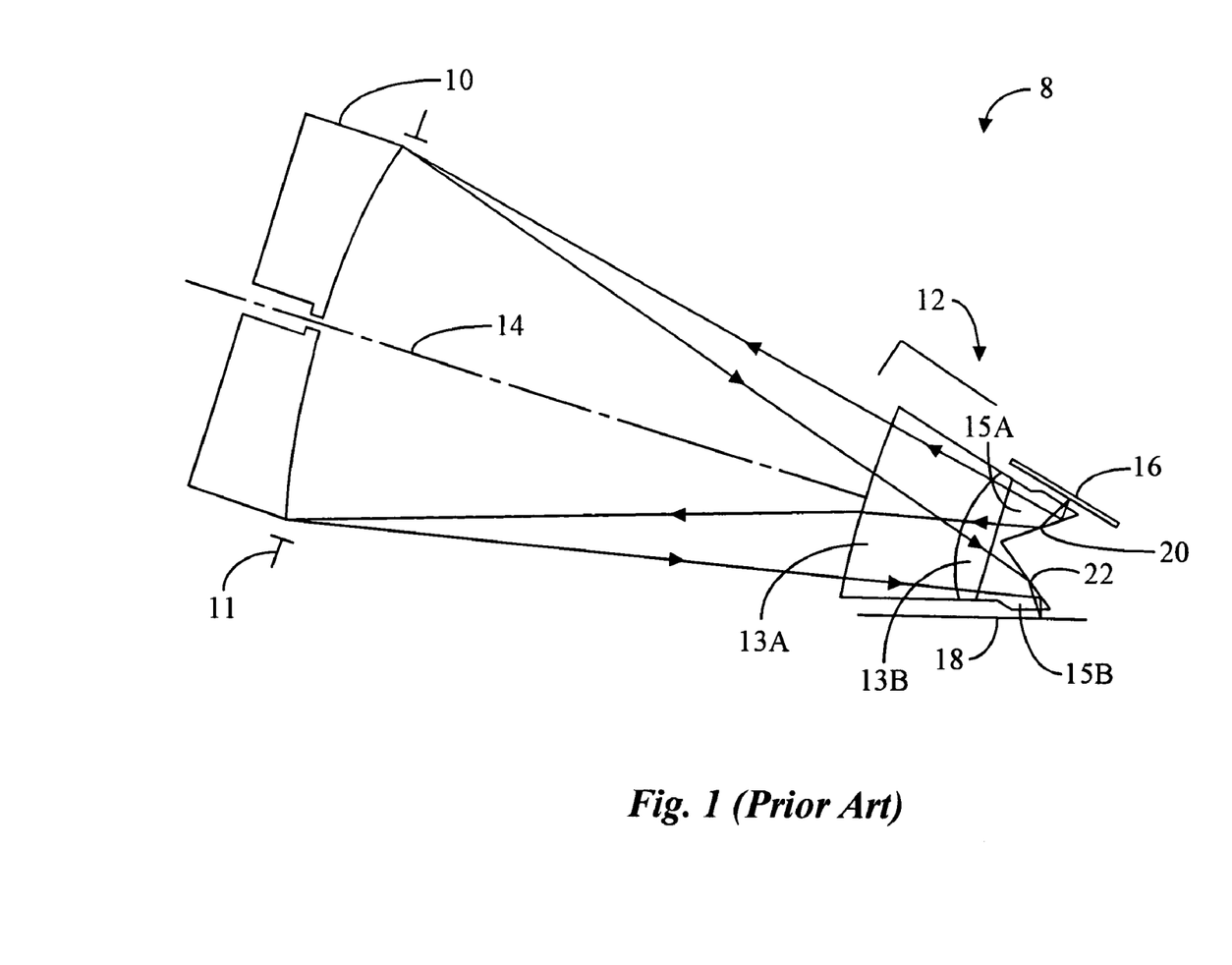
FIG. 1 is a cross-sectional diagram of an example prior art unit-magnification projection optical system according to the '494 patent.

FIG. 1 is a cross-sectional diagram of an example prior art optical system 8 according to the '494 patent. The optical system described in the '494 patent and illustrated in FIG. 1 is a unit-magnification, catadioptric, achromatic and anastigmatic, optical projection system that uses both reflective and refractive elements in a complementary fashion to achieve large field sizes and high numerical apertures (NAs). The system is basically symmetrical relative to an aperture stop located at the mirror, thus eliminating odd order aberrations such as coma, distortion and lateral color. All of the spherical surfaces are nearly concentric, with the centers of curvature located close to where the focal plane would be located were the system not folded. Thus, the resultant system is essentially independent of the index of refraction of the air in the lens, making pressure compensation unnecessary.

With continuing reference to FIG. 1, optical system 8 includes a concave spherical mirror 10, an aperture stop 11 located at the mirror, and a composite, achromatic plano-convex doublet lens-prism assembly 12. Mirror 10 and assembly 12 are disposed symmetrically about an optical axis 14. Optical system 8 is essentially symmetrical relative to aperture stop 11 so that the system is initially corrected for coma, distortion, and lateral color. All of the spherical surfaces in optical system 8 are nearly concentric.

In optical system 8, doublet-prism assembly 12 includes a meniscus lens 13A, a plano-convex lens 13B and symmetric fold prisms 15A and 15B located on opposite sides of optical axis 14. In conjunction with mirror 10, assembly 12 corrects the remaining optical aberrations, which include axial color, astigmatism, petzval, and spherical aberration. Symmetric fold prisms 15A and 15B are used to attain sufficient working space for movement of a reticle 16 and a wafer 18. The cost of this gain in working space is the reduction of available field size to about 25% to 35% of the total potential field. In the past, this reduction in field size has not been critical since it has been possible to obtain both acceptable field size and the resolution required for the state-of-the-art circuits. However, today this field size reduction is problematic.

Figure 2:
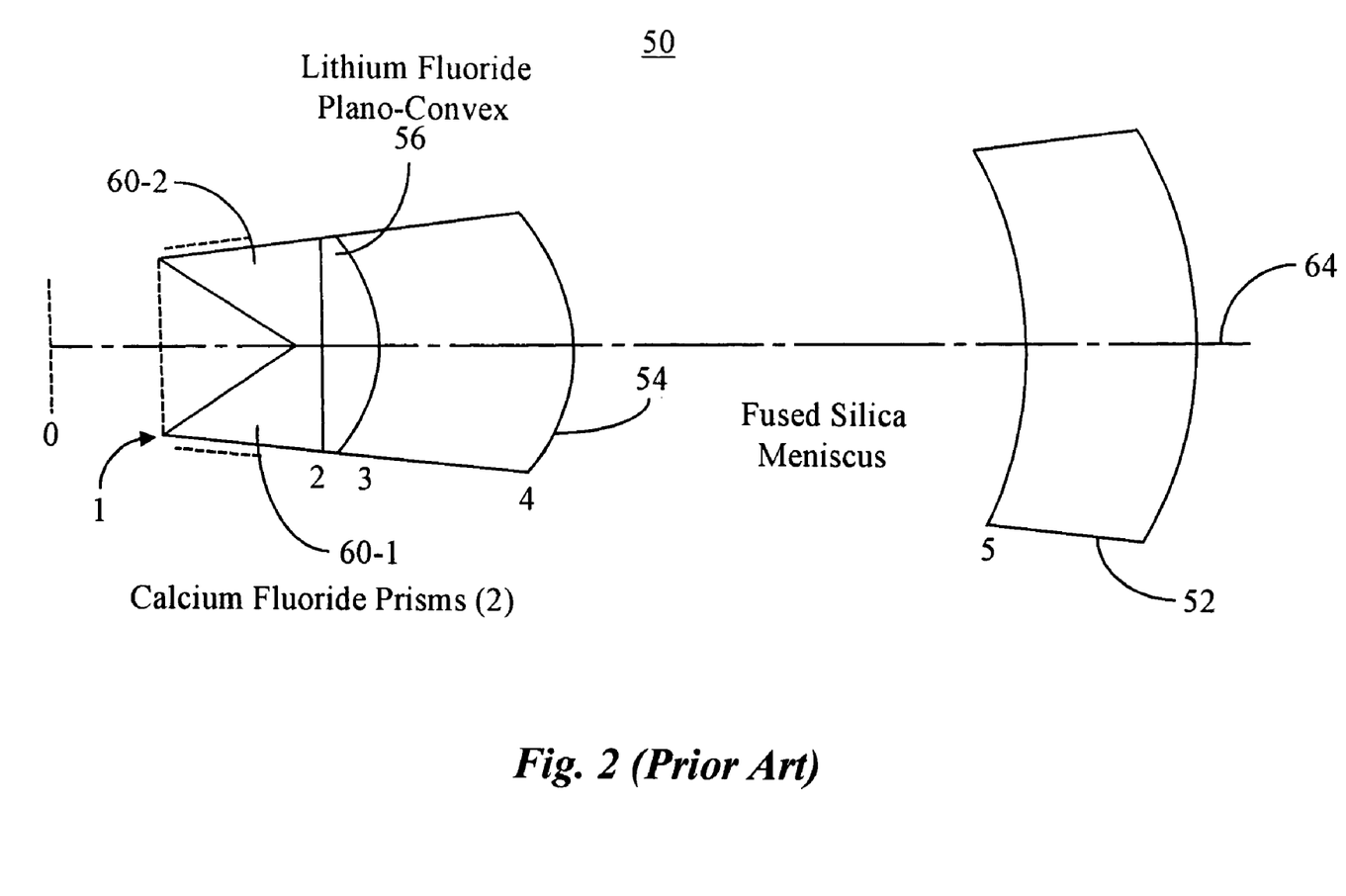
FIG. 2 is a cross-sectional diagram of an example prior art unit-magnification projection optical system according to the '977 patent.

FIG. 2 is a cross-sectional diagram of an example prior art optical system 50 according to the '977 patent. System 50 includes a first mirror 52 and a meniscus lens 54 which is desirably of fused silica. System 50 also includes a plano-convex lens 56, desirably of lithium fluoride, and a pair of prisms 60-1, 60-2 made of calcium fluoride. System 50 includes an optical axis 64. Operation of optical system 50 with a source of light exposure (desirably in the ultraviolet range) is analogous to that described in the '494 patent. System 50 has a numerical aperture (NA) of 0.350 and design wavelengths of 249.8 nanometers and 243.8 nanometers. The air-lens and lens-lens transitions in optical system 50 are labeled 1, 2, 3, 4 and 5 across the bottom of FIG. 2.

Unfortunately, for larger NA applications (i.e., NA≧0.435), both the '494 and the '977 systems of a reasonable size cannot achieve high quality imagery over field sizes having a field height larger than 23 mm in the DUV (Deep Ultra-violet) spctrum.

SUMMARY OF THE INVENTION

A first aspect of the invention is a projection optical system. The system includes along an optical axis a mirror having a concave surface, and an aperture stop located at the mirror that determines a numerical aperture (NA) of the system. The system also includes a lens group with positive refracting power arranged adjacent the mirror and spaced apart therefrom. The lens group comprises in order towards the mirror: a) first and second prisms arranged on opposite sides of the optical axis and each having a planar surface, wherein the planar surfaces are arranged adjacent object and image planes, respectively; and b) a first positive lens, a second negative lens, a third positive lens and a fourth negative lens, wherein the lenses of the lens group have surfaces that are non-concentric with respect to the mirror surface.

A second aspect of the invention is a photolithography system that includes the projection optical system of the present invention.

The various elements depicted in the drawings are merely representational and are not necessarily drawn to scale. Certain proportions thereof may be exaggerated, while others may be minimized. The drawings are intended to illustrate various implementations of the invention, which can be understood and appropriately carried out by those of ordinary skill in the art.

DETAILED DESCRIPTION OF THE INVENTION

The unit-magnification projection optical system of the present invention is an improvement over the prior art optical system of the '494 patent and the '977 patent, embodiments of which are described briefly above and illustrated in FIGS. 1 and 2.

The projection optical system of the present invention provides an optical design configuration that forms the basis of the unit magnification projection optical system suitable for application in exposure apparatus utilizing illumination systems with excimer laser radiation sources such as a KrF laser (248nm), an ArF laser (193 nm) and an F2 laser (157nm). Moreover, the present invention provides a common lens design configuration with refractive optical components (prism and tens elements) manufacturable using low refractive index optical materials (such as fused silica, calcium fluoride, barium fluoride, strontium fluoride, etc.), that transmit radiation having the above-mentioned DUV laser wavelengths.

The projection optical system of the present invention as described in detail below has very good image quality (i.e., Strehl ratios greater than 0.96).

Figure 3:
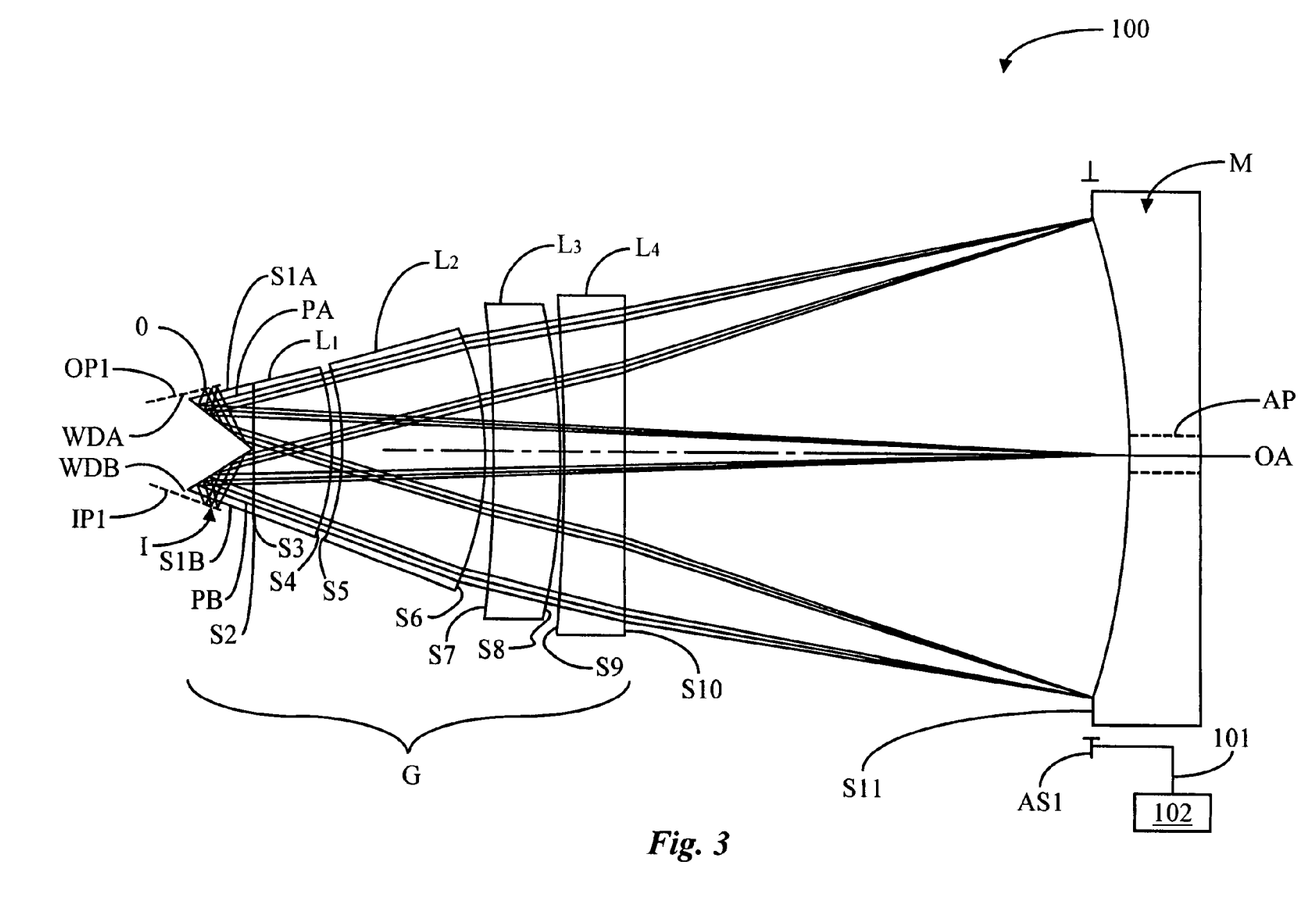
FIG. 3 is cross-sectional diagram of a generalized embodiment of the unit-magnification projection optical system of the present invention.

FIG. 3 is a cross-sectional diagram of a generalized embodiment of a DUV unit-magnification projection optical system 100 according to the present invention. Projection optical system 100 includes, along an axis OA, a concave spherical mirror M. In an example embodiment, mirror M includes an aperture AP on the optical axis. Aperture AP may be used, for example, to introduce light into the optical system for performing functions other than direct imaging with optical system 100, such as for aligning an object (e.g., a mask) with its image, or inspecting the object.

Optical system 100 further includes an aperture stop AS1 located at mirror M. In an example embodiment, aperture stop AS1 is variable and may include any one of the known forms for varying the size of an aperture in an optical system, such as an adjustable iris. In an example embodiment, the size of variable aperture stop AS1 is manually set. In another example embodiment, variable aperture stop AS1 is operatively connected via a line 101 (e.g., a wire) to a controller 102 that allows for automatically setting the size of the aperture stop. Aperture stop AS1 defines the numerical aperture NA of the system, which in example embodiments of the present invention is in the range of between 0.3 and 0.5 (inclusive).

Optical system 100 further includes a prism/lens group G (hereinafter, simply "lens group G") with positive refractive power arranged along axis OA adjacent to, and spaced apart from, mirror M. Lens group G includes two prisms PA and PB farthest from mirror M and located on opposite sides of optical axis OA. Prism PA has a planar surface S1A, and prism PB has a planar surface S1B. Surface S1A faces an object plane OP1 and surface S1B faces an image plane IP1. The object plane OP1 and the image plane IP1 are spaced apart from respective planar surfaces S1A and S1B by respective gaps WDA and WDB representing working distances. In example embodiments where there is complete symmetry with respect to aperture stop AS1, WDA=WDB. Since WDA and WDB are equal to each other, in the accompanying Tables 1–7 those distances are referred collectively to as WD.

Prisms PA and PB play a role in the aberration correction, including chromatic aberration correction. Prisms PA and PB also serve to separate object plane OP1 from image plane IP1 (without prisms PA and PB, the object and image planes would be co-planar).

Lens group G further includes, in order from prisms PA and PB toward mirror M, lens elements L1, L2, L3, and L4 disposed symmetrically about axis OA. The refractive powers of the lens elements are such that L1 is positive, L2 is negative, L3 is positive and L4 is negative. The planar surface S2 of each of prisms PA and PB is opposite the ulanar surface S3 of lens $L_1$, the convex surface S4 of lens $L_1$ is opposite the concave surface S5 of lens $L_2$ the convex surface S6 of lens $L_2$ is opposite the high radius concave surface S7 of lens $L_3$, the high radius convex surface S8 of lens $L_3$ is opposite the high radius concave surface S9 of lens $L_4$ and the surface S10 of lens $L_4$ is facing and spaced auart from the concave surface S11 of mirror M. The optical system is also basically symmetrical relative to aperture stop AS1 and thus initially corrected for coma, distortion,, and lateral color. Moreover, the lens group G, in conjunction with the prisms PA and PB, and the mirror M, corrects the remaining optical aberrations, which include axial color, astigmatism, petzval, and spherical aberration. The chromatic variations of the optical aberrations are reduced also by the +–+–lens element geometry and by the alternating optical materials choice. Together, these two features greatly help to boost the optical performance of optical system 100 in achieving a sufficiently high quality imagery over a large field and with a high numerical aperture in a 1×, DUV exposure system. In particular, L3 and L4, improve the overall correction of astigmatism and petzval curvature in optical system 100 helping to provide a fiat field. Mirror M, when aspherized corrects higher order spherical aberrations, and also improves the overall residual aberration balance in system 100.

The respective working distances WDA and WDB provide sufficient mechanical clearances and spaces for positioning a large wafer W and a large reticle R in image plane IP1 and object plane OP1, respectively.

Example Designs

While the projection optical system of the present invention is described in conjunction with the optical design layout shown in FIG. 3, it will be understood that it is not intended to limit the invention to this design form, but also intended to cover alternatives, modifications and equivalents as may be included within the spirit and scope of the invention as defined and described in connection with particular design examples having the optical prescriptions shown in Tables 1–7, and as set forth in the claims. Each of the design examples in Table 1–7, has a design form based on the general design configuration illustrated in FIG. 3.

Since projection optical system 100 of the present invention is completely symmetric with respect to aperture stop AS1 at mirror M, the optical prescriptions in accompanying Tables 1–7 include only values of the optical specifications from object plane OP1 to the concave mirror M.

In Tables 1–7, a positive radius indicates the center of curvature is to the right of the surface, and a negative radius indicates the center of curvature is to the left. The thickness is the axial distance to the next surface. All dimensions are in millimeters. All of the example embodiments basically preserve the system symmetry relative to the aperture stop located at the concave mirror thus inherently eliminating the odd order aberrations such as coma, distortion, and lateral color. There are no lens elements with concentric surfaces in lens group G, nor are there any lens surfaces that are concentric with mirror M.

Further, "S#" stands for surface number, e.g. as labeled across the bottom of the lens system in FIG. 3, "T or S" stands for "thickness or separation", and "STOP" stands for "aperture stop AS1". Also, "CC" stands for "concave" and "CX" stands for "convex."

Further, under the heading "surface shape", an aspheric surface is denoted by "ASP", a planar (flat) surface by "FLT" and a spherical surface by "SPH".

The aspheric equation describing an aspherical surface is given by:

$$Z = \frac{(CURV)Y^2}{1 + (1 - (1+K)(CURV)^2 Y^2)^{1/2}} + (A)Y^4 + (B)Y^6 + (C)Y^8 + (D)Y^{10}$$

wherein "CURV" is the spherical curvature of the surface, K is the conic constant, and A, B, C, and D are the aspheric coefficients. In the Tables, "E" denotes exponential notation (powers of 10).

In the projection optical system 100 as set forth in Table 1, prisms PA and PB, and lenses L1–L4 are all formed from fused silica and are spherical lenses. The NA is 0.435, the field height is 23.2 mm. The operating wavelength range is 248.39 nm (±0.1 nm), which makes the lens suitable for use with a DUV laser radiation source. When employed with a narrowed or ultra-line narrowed DUV laser source, optical system 100 yields reasonably high quality imagery.

In the projection optical system 100 as set forth in Table 2, prisms PA and PB and lenses L1 and L3 are formed from calcium fluoride, and lenses L2 and L4 are formed from fused silica. All the lenses are spherical lenses. In addition, mirror M has an aspherical surface. The NA is 0.435, the field height is 23.2 mm. The operating wavelength range is 248.34 nm (±0.5 nm), which makes the lens suitable for use with a DUV laser radiation source. The combination of calcium fluoride and fused silica materials for the lens group G, i.e. calcium fluoride for the positive lens elements and fused silica for the negative elements, corrects axial color and the chromatic variations of residual aberrations. This enables optical system 100 to operate with a broader line width DUV laser source. The aspheric mirror corrects high order spherical aberration and thus improves overall system performance.

TABLE 1

NA = 0.435 Field Height (mm) = 23.2
Design Wavelengths (nm) 248.39 ± 0.1

| S# | RADIUS | SHAPE | T or S | MATERIAL | ELEMENT DESCRIPTION |
|---|---|---|---|---|---|
| 0 | INF | FLT | 0.0000 | | |
|   |     |     | 3.5021 | | Working distance WD |
| 1 | INF | FLT | 34.0000 | Fused Silica | Prism A/Prism B glass path |
| 2 | INF | FLT | 0.0000 | | |
| 3 | INF | FLT | 43.9936 | Fused Silica | L1 |
| 4 | −140.088 CX | SPH | 4.6554 | | |
| 5 | −115.435 CC | SPH | 77.8000 | Fused Silica | L2 |
| 6 | −158.457 CX | SPH | 1.5000 | | |
| 7 | −2198.913 CC | SPH | 38.0000 | Fused Silica | L3 |
| 8 | −411.153 CX | SPH | 2.7870 | | |
| 9 | −1423.533 CC | SPH | 38.0000 | Fused Silica | L4 |
| 10 | 3458.549 CC | SPH | 305.7620 | | |
| 11 | −543.979 CC | SPH | −305.7620 | REFL (STOP) | Mirror M |

TABLE 2

NA = 0.435 Field Height (mm) = 23.2 Design Wavelengths (nm) = 248.34 ± 0.5

| S# | RADIUS | | SHAPE | T or S | MATERIAL | ELEMENT DESCRIPTION |
|---|---|---|---|---|---|---|
| 0 | INF | | FLT | 0.0000 | | |
|   |     | |     | 5.4824 | | Working distance WD |
| 1 | INF | | FLT | 34.0000 | Calcium Fluoride | Prism A/Prism B glass path |
| 2 | INF | | FLT | 0.0000 | | |
| 3 | INF | | FLT | 28.3056 | Calcium Fluoride | L1 |
| 4 | −114.898 | CX | SPH | 4.4701 | | |
| 5 | −101.751 | CC | SPH | 77.8000 | Fused Silica | L2 |
| 6 | −145.446 | CX | SPH | 1.6688 | | |
| 7 | −647.352 | CC | SPH | 38.0000 | Calcium Fluoride | L3 |
| 8 | −447.517 | CX | SPH | 1.5000 | | |
| 9 | −1817.472 | CC | SPH | 38.0000 | Fused Silica | L4 |
| 10 | −5113.783 | CX | SPH | 310.7731 | | |
| 11 | −531.928 | CC | ASP | −310.7731 | REFL (STOP) | Mirror M |

| ASPHERIC S# | CURV | K | A | B | C | D |
|---|---|---|---|---|---|---|
| S11 | −0.00187995 | 0.000000 | 5.90655E−12 | 8.61447E−17 | 5.86675E−22 | 8.42714E−27 |

In the projection optical system 100 as set forth in Table 3, prisms PA and PB and lenses L1–L4 are all formed from fused silica. All the lenses have spherical surfaces. In addition, the mirror has an aspherical surface. The NA is 0.435, the field height is 23.2 mm. The operating wavelength range is 193.3 nm (±0.1 nm), which makes the lens suitable for use with a DUV line narrowed or ultra-line narrowed laser radiation source.

TABLE 3

NA = 0.435 Field Height (mm) = 23.2 Design Wavelengths (nm) = 93.3 ± 0.1

| S# | RADIUS | SHAPE | | T or S | MATERIAL | ELEMENT DESCRIPTION |
|---|---|---|---|---|---|---|
| 0 | INF | | FLT | 0.0000 | | |
| | | | | 4.0000 | | Working distance WD |
| 1 | INF | | FLT | 34.0000 | Fused Silica | Prism A/Prism B glass path |
| 2 | INF | | FLT | 0.0000 | | |
| 3 | INF | | FLT | 43.9936 | Fused Silica | L1 |
| 4 | −137.305 | CX | SPH | 4.3078 | | |
| 5 | −116.108 | CC | SPH | 77.8000 | Fused Silica | L2 |
| 6 | −161.314 | CX | SPH | 1.5000 | | |
| 7 | −481.652 | CC | SPH | 38.0000 | Fused Silica | L3 |
| 8 | −395.742 | CX | SPH | 1.5002 | | |
| 9 | −1012.080 | CC | SPH | 38.0000 | Fused Silica | L4 |
| 10 | −1266.111 | CX | SPH | 306.8983 | | |
| 11 | −544.016 | CC | ASP | −306.8983 | REFL (STOP) | Mirror M |

| ASPHERIC S# | CURV | K | A | B | C | D |
|---|---|---|---|---|---|---|
| S11 | −0.00183818 | 0.000000 | 2.58962E−11 | 1.98197E−16 | 8.56012E−22 | 1.50805E−26 |

In the projection optical system 100 as set forth in Table 4, prisms PA and PB and lenses L1 and L3 are formed from calcium fluoride, and lenses L2 and L4 are formed from fused silica. All the lenses have spherical surfaces, and mirror M has a spherical surface. The NA is 0.435, and the field height is 23.2 mm. The operating wavelength range is 193.3 nm (±0.1 nm), which makes the lens suitable for use with a DUV laser radiation source. Using calcium fluoride substrate material for positive lens elements and fused silica substrate material for negative elements enhances the correction of axial chromatic aberration as well as reduces the chromatic variation of field aberrations.

TABLE 4

NA = 0.435 Field Height (mm) = 23.2 Design Wavelengths (nm) = 193.3 ± 0.1

| S# | RADIUS | SHAPE | | T or S | MATERIAL | ELEMENT DESCRIPTION |
|---|---|---|---|---|---|---|
| 0 | INF | | FLT | 0.0000 | | |
| | | | | 3.5000 | | Working distance WD |
| 1 | INF | | FLT | 34.0000 | Calcium Fluoride | Prism A/Prism B glass path |
| 2 | INF | | FLT | 0.0000 | | |
| 3 | INF | | FLT | 43.9936 | Calcium Fluoride | L1 |
| 4 | −137.984 | CX | SPH | 5.7288 | | |
| 5 | −116.193 | CC | SPH | 77.8000 | Fused Silica | L2 |
| 6 | −158.614 | CX | SPH | 13.8279 | | |
| 7 | −1852.115 | CC | SPH | 38.0000 | Calcium Fluoride | L3 |
| 8 | −515.570 | CX | SPH | 1.5000 | | |
| 9 | −3516.377 | CC | SPH | 38.0000 | Fused Silica | L4 |
| 10 | 3090.388 | CC | SPH | 293.6497 | | |
| 11 | −543.130 | CC | SPH | −293.6497 | REFL (STOP) | Mirror M |

In the projection optical system 100 as set forth in Table 5, prisms PA and PB and lenses L1 and L3 are formed from calcium fluoride, and lenses L2 and L4 are formed from fused silica. All the lenses have spherical surfaces, and mirror M has an aspherical surface. The NA is 0.435, the field height is 23.2 mm. The operating wavelength range is 193.3 nm (±0.1 nm), which makes the lens suitable for use with a DUV laser radiation source. As in the embodiment of Table 4, the embodiment of Table 5 has well-corrected chromatic aberrations and chromatic variations of residual field aberrations. The aspheric mirror M provides correction of higher order spherical aberrations and overall balance of residual aberrations.

TABLE 5

NA = 0.435 Field Height (mm) = 23.2 Design Wavelengths (nm) = 193.3 ± 0.1

| | SURFACE DESCRIPTION | | | | ELEMENT |
|---|---|---|---|---|---|
| S# | RADIUS | | SHAPE | T or S | MATERIAL | DESCRIPTION |
| 0 | INF | | FLT | 0.0000 | | |
| | | | | 3.5000 | | Working distance WD |
| 1 | INF | | FLT | 34.0000 | Calcium Fluoride | Prism A/Prism B glass path |
| 2 | INF | | FLT | 0.0000 | | |
| 3 | INF | | FLT | 43.9936 | Calcium Fluoride | L1 |
| 4 | −138.821 | CX | SPH | 6.2692 | | |
| 5 | −116.466 | CC | SPH | 77.8000 | Fused Silica | L2 |
| 6 | −158.824 | CX | SPH | 2.0521 | | |
| 7 | −1391.235 | CC | SPH | 38.0000 | Calcium Fluoride | L3 |
| 8 | −457.136 | CX | SPH | 1.5000 | | |
| 9 | −2126.796 | CC | SPH | 38.0000 | Fused Silica | L4 |
| 10 | 5607.105 | CC | SPH | 304.8851 | | |
| 11 | −543.641 | CC | ASP | −304.8851 | REFL (STOP) | Mirror M |

| ASPHERIC S# | CURV | K | A | B | C | D |
|---|---|---|---|---|---|---|
| S11 | −0.00183945 | 0.000000 | 1.14297E−12 | 1.51380E−17 | 1.57864E−23 | 5.81245E−27 |

In the projection optical system 100 as set forth in Table 6, prisms PA and PB and lenses L1–L4 are all formed from calcium fluoride. All the lenses have spherical surfaces. In addition, the mirror has an aspherical surface. The NA is 0.435, the field height is 23.2 mm. The operating wavelength range is 157.631 nm (±0.0008 nm), which makes the lens suitable for use with a DUV line narrowed or ultra-line narrowed laser radiation source.

calcium fluoride. All the lenses have spherical surfaces. In addition, the mirror has an aspherical surface. The NA is 0.50, and the field height is 23.2 mm. The operating wavelength range is 157.631 nm (±0.0008 nm), which makes the lens suitable for use with a DUV line narrowed or ultra line narrowed laser radiation source. A broader DUV laser source may be used if the two optical materials are used in the embodiments shown in Tables 6 and 7, such as calcium

TABLE 6

NA = 0.435 Field Height (mm) = 23.2 Design Wavelengths (nm) = 157.631 ± 0.0008

| | SURFACE DESCRIPTION | | | | ELEMENT |
|---|---|---|---|---|---|
| S# | RADIUS | | SHAPE | T or S | MATERIAL | DESCRIPTION |
| 0 | INF | | FLT | 0.0000 | | |
| | | | | 4.0000 | | Working distance WD |
| 1 | INF | | FLT | 34.0000 | Calcium Fluoride | Prism A/Prism B glass path |
| 2 | INF | | FLT | 0.0000 | | |
| 3 | INF | | FLT | 47.5563 | Calcium Fluoride | L1 |
| 4 | −140.686 | CX | SPH | 4.4547 | | |
| 5 | −117.667 | CC | SPH | 77.8000 | Calcium Fluoride | L2 |
| 6 | −162.562 | CX | SPH | 1.5000 | | |
| 7 | −528.689 | CC | SPH | 38.0000 | Calcium Fluoride | L3 |
| 8 | −401.134 | CX | SPH | 1.5000 | | |
| 9 | −1563.422 | CC | SPH | 38.0000 | Calcium Fluoride | L4 |
| 10 | −2463.529 | CX | SPH | 303.1890 | | |
| 11 | −544.406 | CC | ASP | −303.1890 | REFL (STOP) | Mirror M |

| ASPHERIC S# | CURV | K | A | B | C | D |
|---|---|---|---|---|---|---|
| S11 | −0.00183686 | 0.000000 | 1.96149E−11 | 1.55956E−16 | 8.12495E−22 | 1.21311E−26 |

In the projection optical system 100 as set forth in Table 7, prisms PA and PB and lenses L1–L4 are all formed from fluoride for the positive lens elements and barium fluoride for the negative lens elements.

TABLE 7

| NA = 0.50 Field Height (mm) = 23.2 Design Wavelengths (nm) = 157.631 ± 0.0008 ||||||
|---|---|---|---|---|---|
| SURFACE DESCRIPTION |||| | ELEMENT |
| S# | RADIUS | | SHAPE | T or S | MATERIAL | DESCRIPTION |
| 0 | INF | | FLT | 0.0000 | | |
| | | | | 4.0000 | | Working distance WD |
| 1 | INF | | FLT | 34.0000 | Calcium Fluoride | Prism A/Prism B glass path |
| 2 | INF | | FLT | 0.0000 | | |
| 3 | INF | | FLT | 47.5563 | Calcium Fluoride | L1 |
| 4 | −146.835 | CX | SPH | 4.9586 | | |
| 5 | −120.689 | CC | SPH | 77.8000 | Calcium Fluoride | L2 |
| 6 | −163.592 | CX | SPH | 1.5000 | | |
| 7 | −546.710 | CC | SPH | 38.0000 | Calcium Fluoride | L3 |
| 8 | −403.614 | CX | SPH | 1.5000 | | |
| 9 | −2316.156 | CC | SPH | 38.0000 | Calcium Fluoride | LE |
| 10 | −3758.411 | CX | SPH | 302.6851 | | |
| 11 | −545.373 | CC | ASP | −302.6851 | REFL (STOP) | Mirror M |

| ASPHERIC S# | CURV | K | A | B | C | D |
|---|---|---|---|---|---|---|
| S11 | −0.00183361 | 0.000000 | 2.61844E−11 | 1.93771E−16 | 8.38751E−22 | 1.46130E−26 |

Photolithography System

Figure 4:
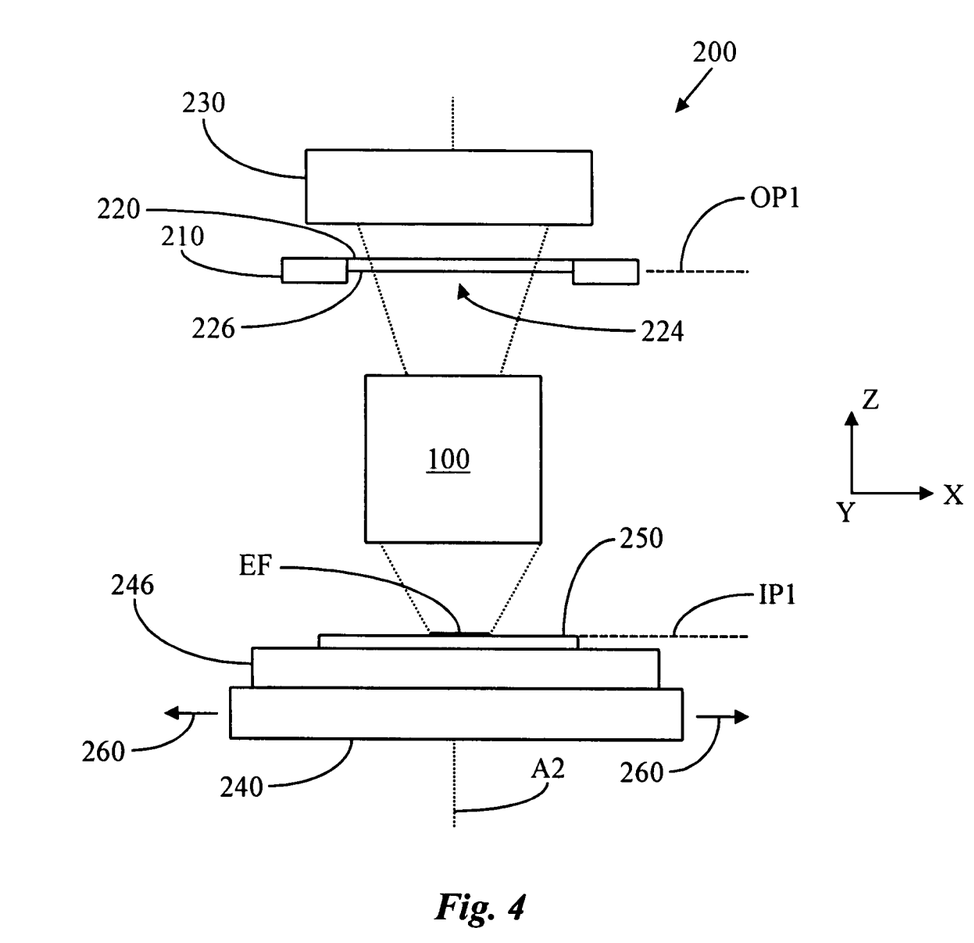
FIG. 4 is a schematic diagram of a photolithography system employing the unit-magnification projection optical system of the present invention.

FIG. 4 is a schematic diagram of a photolithography system 200 employing the unit-magnification projection optical system 100 of the present invention. System 200 has an optical axis A2 and includes along the optical axis a mask stage 210 adapted to support a mask 220 at object plane OP1. Mask 220 has a pattern 224 formed on a mask surface 226. An illuminator 230 is arranged adjacent mask stage 210 opposite optical system 100 and is adapted to illuminate mask (reticle) 220.

System 200 also includes a wafer stage 240 adapted to movably support a wafer 246 at image plane IP1. In an example embodiment, wafer 246 is coated with a photosensitive layer 250 that is activated by one or more wavelengths of radiation from the illuminator. Such radiation is referred to in the art as "actinic radiation". In an example embodiment, the one or more wavelengths of radiation include 248 nm, 193 nm and 157 nm.

In operation, illuminator 230 illuminates mask 220 while stage 240 positions wafer 250 to align the image with previously produced patterns so that pattern 224 is imaged at wafer 246 by optical system 100, thereby forming a pattern in photoresist layer 250. The result is an exposure field EF that occupies a portion of the wafer surface. Wafer stage 240 then moves ("steps") wafer 246 in a given direction 260 (e.g., the x-direction) by a given increment (e.g., the size of one exposure field EF), and the exposure process is repeated. This step-and-repeat exposure process is continued (hence the name "step-and-repeat" until a desired number of scanned exposure fields EF are formed on wafer 246.

Wafer 246 is then removed from system 200 (e.g., using a wafer handling system, not shown) and processed (e.g., developed, baked, etched, etc.) to transfer the pattern formed in the photoresist in each exposure field EF to the underlying layer(s) on the wafer. Once the pattern is transferred the resist is typically stripped, a new layer of material is added with a deposition process, and the wafer is again coated with resist. Repeating the photolithography process with different masks allows for three-dimensional structures to be formed in the wafer to create operational devices, such as ICs.

In the foregoing Detailed Description, various features are grouped together in various example embodiments for ease of understanding. The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, the invention is not to be limited to the exact construction and operation described herein. Accordingly, other embodiments are within the scope of the appended claims and the invention is only limited by the scope of the appended claims.

What is clamed is:

1. A projection optical system comprising along an optical axis:
   a mirror having a concave surface;
   an aperture stop located at the mirror that determines a numerical aperture (NA) of the system; and
   a lens group with positive refracting power arranged adjacent and spaced apart from the mirror, the lens group comprising in order towards the mirror:
      first and second prisms arranged on opposite sides of the optical axis and each having a planar surface, wherein the planar surfaces are arranged adjacent object and image planes, respectively; and
      a group of four lenses individually separated from each other selected distances between each pair of adjacent lenses, with said group of four lenses consisting of two positive lenses and two negative lenses.

2. The projection optical system of claim 1, wherein the first and second prisms and the four lenses are each made of either fused silica or caldum fluoride.

3. A projection optical system comprising along an optical axis:
   a mirror having a concave surface;
   an aperture stop located at the mirror that determines a numerical aperture (NA) of the system in a range 0.43=NA=0.5;

a lens group with positive refracting power arranged adjacent and spaced aprat from the mirror, the lens group comprising in order towards the mirror:

first and second prisms arranged on opposite sides of the optical axis and each having a planar surface, wherein the planar surfaces are arranged adjacent object and image planes, respectively; and a lens group consisting of first through fourth lenses made of either fused silica or calcium fluoride and each having a convex surface facing the mirror, wherein the first lens is a plano convex lens, the second lens is a negative meniscus lens, the third lens is a positive meniscus lens, and the fourth lens is a negative meniscus lens with said first through fourth lenses individually separated from each other selected distances between each pair of adjacent lenses.

4. The projection optical system of claim 3, wherein the system forms a corrected image at or near a wavelength selected from the group of wavelengths consisting of: 193 nm, 157 nm and 248 nm.

5. The projection optical system of claim 4, wherein the mirror is aspheric.

6. An optical system comprising along an optical axis:

a modified Dyson system having a concave mirror and a spaced apart prism assembly having identical fold prisms arranged on either side of the optical axis; and four lenses operably arranged between the prism assembly and the concave mirror and having a positive-negative-positive-negative arrangement in order towards the concave mirror with said four lenses individually separated from each other selected distances between each Dair of adjacent lenses.

7. A method of patterning a wafer having an upper suiface that is photosensitive to a select wavelength of radiation, said method comprising the steps of:

a) directing radiation of the selected wavelength to a reticle having a selected pattern thereon with radiation passing through the reticle taking on the selected pattern;

b) directing the radiation having passed through the reticle to an object plane at a first face of a first prism and being reflected therein to a second face of the first prism on one side of an optical axis of a lens group with positive refracting power to which said second face of the first prism is adjacent to redirect the passing radiation to said lens group;

c) continue directing said passing radiation through said one side of the optical axis of said lens group initially to and through a first lens with positive power then to and through a second lens having negative power then to and through a third lens with positive power then to and through a fourth lens with negative power with said first, second, third and fourth lenses being individually separated from each other by selected first, second and third distances, respectively, between each pair of adjacent lenses;

d) continue directing said passing radiation from said fourth lens of said lens group to a mirror having a concave surface with said mirror spaced a selected fourth distance from said fourth lens of said lens group and having an aperture stop located at the mirror to control a numerical aperture (NA) of the system;

e) reflecting said passing radiation by said mirror to said fourth lens of said lens group on a second side of the optical axis;

f) continue directing said passing radiation through the lens group in the opposite order to that of step c);

g) continue directing said passing radiation to a first face of a second prism adjacent said first lens on the second side of the optical axis and being reflected therein to a second face of the second prism at an object plane;

h) positioning said wafer at or near said image plane; and i) imaging said photosensitive surface of said wafer with said passing radiation from said second face of said second prism with the pattern on said reticle of step a).

8. The method of claim 7, wherein:

in step i) said imaging results in the formation of an exposure field on a portion of the wafer upper surface; and said method further includes the step of:

i) repeating said imaging step i) on different portions of the wafer upper surface to substantially cover the wafer upper surface with exposure fields.

9. The method of claim 8 further includes the step of:

k) coordinating step h) and j) to move the wafer during each imaging step i) to create scanned exposure fields on the wafer upper surface.

10. A method of processing a wafer having a surface that is photosensitive to a select wavelength of radiation, said method comprising the steps of:

a) irradiating a reticle having a selected pattern thereon with radiation of said select wavelength that is at or near one of 248 nm, 193 nm and 157 nm wherein radiation passing through the reticle takes on the selected pattern;

b) directing the radiation having passed through the reticle to an object plane at a first face of a first prism and being reflected therein to a second face of the first prism on one side of an optical axis of a lens group with positive refracting power to which said second face of the first prism is adjacent to redirect the passing radiation to said lens group;

c) continue directing said passing radiation through said one side of the optical axis of said lens group initially to and through a first lens with positive power then to and through a second lens having negative power then to and through a third lens with positive power then to and through a fourth lens with negative power with said first, second, third and fourth lenses being individually separated from each other by selected first, second and third distances, respectively, between each pair of adjacent lenses;

d) continue directing said passing radiation from said fourth lens of said lens group to a mirror having a concave surface with said mirror spaced a selected fourth distance from said fourth lens of said lens group and having an aperture stop located at the mirror to control a numerical aperture (NA) of the system;

e) reflecting said passing radiation by said mirror to said fourth lens of said lens group on a second side of the optical axis;

f) continue directing said passing radiation through the lens group in the opposite order to that of step C);

g) continue directing said passing radiation to a first face of a second prism adjacent said first lens on the second side of the optical axis and being reflected therein to a second face of the second prism at an object plane;

h) positioning said wafer at or near said image plane; and i) exposing said photosensitive surface of said wafer with said passing radiation from said second face of said second prism with the pattern on said reticle of step a);

wherein each of said first, second, third and fourth lenses each have a convex surface facing the mirror.

11. A method of processing a wafer having a surface that is photosensitive to a select wavelength of radiation, said method comprising the steps of:
- a) irradiating a reticle having a selected pattern thereon with radiation of said select wavelength that is at or near one of 248 nm, 193 nm and 157 nm wherein radiation passing through the reticle takes on the selected pattern;
- b) directing the radiation having passed through the reticle to a first face of a first prism and being reflected therein to a second face of the first prism;
- c) continue directing said passing radiation to a lens group having an optical axis on a first side of said optical axis initially to and through a first lens with positive power then to and through a second lens having negative power then to and through a third lens with positive power then to and through a fourth lens with negative power with said first, second, third and fourth lenses being individually separated from each other by selected first, second and third distances, respectively, between each pair of adjacent lenses;
- d) continue directing said passing radiation from said fourth lens of said lens group to a mirror having a concave surface with said mirror spaced a selected fourth distance from said fourth lens of said lens group;
- e) reflecting said passing radiation by said mirror to said fourth lens of said lens group on a second side of the optical axis;
- f) continue directing said passing radiation through the lens group in the opposite order to that of step c);
- g) continue directing said passing radiation to a first face of a second prism adjacent said first lens and being reflected therein to a second face of the second prism wherein said first and second prisms are substantially identical with said first prism on one side of the optical axis and said second prism on a second side of the optical axis;
- h) positioning said wafer adjacent said second face of said second prism; and
- i) exposing said photosensitive surface of said wafer with said passing radiation from said second face of said second prism with the pattern on said reticle of step a).

12. The method of claim 11, wherein the first and second prisms and the lenses are made from either calcium fluoride or fused silica.

13. A method of processing a wafer having a surface that is photosensitive to a select wavelength of radiation, said method comprising the steps of:
- a) irradiating a reticte having a selected pattern thereon with radiation of said select wavelength that is at or near one of 248 nm, 193 nm and 157 nm wherein radiation passing through the reticle takes on the selected pattern;
- b) directing the passing radiation from the reticle to a modified Dyson system consisting of four non-prism lenses arranged in a positive-negative-positive-negative arrangement between identical fold-prisms and in order toward a concave mirror wherein said four non-prism lenses a individually separated from each other three selected distances between each pair of adjacent lenses and the mirror spaced a fourth selected distance from the closest of the four non-prism lenses;
- c) positioning said wafer adjacent said modified Dyson system; and
- d) exposing said photosensitive surface of said wafer with said passing radiation from said modified Dyson system with the pattern on said reticle of step a).

14. The method of claim 13, wherein the four non-prism lenses are fused silica lenses or calcium fluoride lenses.

* * * * *